United States Patent
Lee et al.

(10) Patent No.: US 9,691,916 B2
(45) Date of Patent: Jun. 27, 2017

(54) SYNTHESIS OF THREE-DIMENSIONAL GRAPHENE FOAM: USE AS SUPERCAPACITORS

(71) Applicant: National University of Singapore, Singapore (SG)

(72) Inventors: Jonghak Lee, Singapore (SG); Barbaros Ozyilmaz, Singapore (SG); Orhan Kahya, Singapore (SG)

(73) Assignee: National University of Singapore, Singapore (SG)

(*) Notice: Subject to any disclaimer, the term of this patent is extended or adjusted under 35 U.S.C. 154(b) by 0 days.

(21) Appl. No.: 15/169,076

(22) Filed: May 31, 2016

(65) Prior Publication Data

US 2016/0271843 A1   Sep. 22, 2016

Related U.S. Application Data

(62) Division of application No. 14/396,000, filed as application No. PCT/SG2013/000231 on Jun. 3, 2013, now Pat. No. 9,352,500.

(Continued)

(51) Int. Cl.
*H01L 31/0224* (2006.01)
*H01G 11/48* (2013.01)
(Continued)

(52) U.S. Cl.
CPC ........ *H01L 31/0224* (2013.01); *B29C 43/003* (2013.01); *C01B 31/0438* (2013.01); *C23F 4/04* (2013.01); *H01G 11/26* (2013.01); *H01G 11/28* (2013.01); *H01G 11/34* (2013.01); *H01G 11/36* (2013.01); *H01G 11/38* (2013.01); *H01G 11/48* (2013.01); *H01G 11/68* (2013.01); *H01G 11/70* (2013.01); *H01G 11/86* (2013.01);
(Continued)

(58) Field of Classification Search
None
See application file for complete search history.

(56) References Cited

U.S. PATENT DOCUMENTS

| | | | |
|---|---|---|---|
| 4,756,898 A | 7/1988 | Hopper et al. | |
| 5,993,996 A | 11/1999 | Firsich | |
| 2012/0064409 A1* | 3/2012 | Zhamu | B82Y 30/00 429/221 |

FOREIGN PATENT DOCUMENTS

| | | |
|---|---|---|
| WO | WO-2009/029984 A1 | 3/2009 |
| WO | WO-2010/138619 A2 | 12/2010 |

(Continued)

OTHER PUBLICATIONS

Chen et al "Three Dimensional and Flexible Conductive Interconnected Graphene Networks Grown by Chemical Vapour Deposition" Nature Materials vol. 10, pp. 424-428, 2011.

(Continued)

*Primary Examiner* — Stella Yi
(74) *Attorney, Agent, or Firm* — Cesari and McKenna, LLP

(57) ABSTRACT

The invention relates to three-dimensional crystalline foams with high surface areas, high lithium capacity, and high conductivity for use as electrode materials and methods for their fabrication. In additional embodiments, the invention also relates to the use of three-dimensional crystalline foams as supercapacitors for improved charge and energy storage.

21 Claims, 6 Drawing Sheets

Related U.S. Application Data

(60) Provisional application No. 61/810,425, filed on Apr. 10, 2013, provisional application No. 61/810,419, filed on Apr. 10, 2013, provisional application No. 61/657,143, filed on Jun. 8, 2012, provisional application No. 61/654,171, filed on Jun. 1, 2012.

(51) Int. Cl.
| | |
|---|---|
| *H01G 11/26* | (2013.01) |
| *H01G 11/34* | (2013.01) |
| *H01G 11/36* | (2013.01) |
| *H01G 11/86* | (2013.01) |
| *B29C 43/00* | (2006.01) |
| *H01G 11/68* | (2013.01) |
| *H01G 11/28* | (2013.01) |
| *H01G 11/70* | (2013.01) |
| *C01B 31/04* | (2006.01) |
| *H01G 11/38* | (2013.01) |
| *C23F 4/04* | (2006.01) |
| *B29K 105/04* | (2006.01) |
| *B29L 31/00* | (2006.01) |

(52) U.S. Cl.
CPC ....... *B29K 2105/04* (2013.01); *B29L 2031/00* (2013.01); *Y02E 60/13* (2013.01); *Y10T 29/43* (2015.01); *Y10T 428/24997* (2015.04)

(56) References Cited

FOREIGN PATENT DOCUMENTS

| | | |
|---|---|---|
| WO | WO-2011/026025 A1 | 3/2011 |
| WO | WO-2012/061919 A1 | 5/2012 |
| WO | WO-2012/144993 A1 | 10/2012 |
| WO | WO-2013/066269 | 5/2013 |

OTHER PUBLICATIONS

Kennedy "Porous Metals and Metal Foams Made from Powders" Powder Metallurgy, pp. 31-47, 2012.

Li et al "Three-Dimensional Porous Core-Shell Sn@Carbon Composite Anodes for High-Performance Lithium-Ion Battery Applications" Advanced Energy Materials vol. 2, pp. 238-244, 2012.

Zakhidov et al "Carbon Structures with Three-Dimensional Periodicity at Optical Wavelengths" Science vol. 282, pp. 897-901, 1998.

* cited by examiner

SYNTHESIS OF THREE-DIMENSIONAL GRAPHENE FOAM: USE AS SUPERCAPACITORS

CROSS-REFERENCE TO RELATED APPLICATION

This application is a divisional of U.S. patent application Ser. No. 14/396,000, filed on Oct. 21, 2014, which claims the benefit of International Application No. PCT/SG2013/000231, filed on Jun. 3, 2013, which claims the benefit of U.S. Provisional Application No. 61/654,171, filed on Jun. 1, 2012, U.S. Provisional Application No. 61/657,143, filed on Jun. 8, 2012, U.S. Provisional Application No. 61/810,419, filed on Apr. 10, 2013 and U.S. Provisional Application No. 61/810,425, filed on Apr. 10, 2013. The entire teachings of the above applications are incorporated herein by reference.

BACKGROUND OF THE INVENTION

The development of next-generation flexible electronics, such as soft, portable electronic products, roll-up displays, wearable devices, requires flexible power sources. High capacity and fast charging speed are also very important for applications of high-performance flexible electronics. However, the fabrication of such an energy storage device remains a great challenge owing to the lack of reliable materials that combine superior electron and ion conductivity, robust mechanical flexibility, and excellent corrosion resistance in electrochemical environments.

Activated carbon (AC) is the most commonly used electrode material for supercapacitors and batteries due to their large surface area, porous structure for rapid mass transfer and ion diffusion, and low cost. However, AC suffers from low electronic conductivity (10-12 S cm$^{-1}$) that can hinder the high rate performance of the AC electrode. Recent advances have demonstrated the potential of graphene and group IV-B elements (e.g., silicon, germanium, tin) for use in electrode applications such as secondary batteries and hydrogen storage of fuel cells. While graphene provides electrodes with high electrical conductivity, group IV-B elements, specifically Si-based systems, have been shown to provide electrodes with large theoretical specific capacity at room temperature ($Li_{15}Si_4$: 3600 mAh g−1) [1-3] and low operating voltage (near 0.1 V vs. Li/Li+). [1-3] Nonetheless, these materials still suffer from low specific capacity ($LiC_6$: 372 mAh g−1), large volume changes during the cycling, and poor rate capability [1, 4].

Three-dimensional (3-D) foam is a very promising structure for providing better electrode materials for energy storage devices. One of the most important properties of 3-D foam is their high porosity (fraction of void volume to total volume) and high specific surface area, which has led to many applications concerned with gas storage, separations, and catalysis. Despite the potential of three-dimensional foam, the available methods for their synthesis are limited providing foams with large pore size and small surface areas. [5, 6].

Therefore, a need remains for electrode materials with greater surface area, high Li capacity, and high conductivity and improved methods for their synthesis.

SUMMARY OF THE INVENTION

In a first main aspect, the relates to a method of fabricating a three-dimensional graphene crystalline foam, comprising mixing a carbon source and a skelet powder together to obtain a uniform mixture, wherein the carbon source is optionally coated on a group IV-B element, applying pressure to the mixture obtained in step (a) to obtain a closed packed structure, applying temperature and pressure to the closed packed structure to form a graphene sheet layered around the skelet powder and the group IV-B element if present; and removing the skelet powder from the closed packed structure using a chemical bath to dissolve the skelet powder away from the structure leaving voids, resulting in a three-dimensional crystalline foam comprising graphene and optionally a group IV-B element.

The carbon sources can include, but are not limited to, carbon black, amorphous carbon, or a combination thereof. Skelet powders of various shapes and sizes (e.g., 1 nm to 10 μm) can be used for the methods of this invention including but not limited to, silicon dioxide ($SiO_2$), aluminum oxide ($Al_2O_3$), sodium chloride (NaCl), magnesium oxide (MgO), hafnium oxide ($HfO_2$), zirconium dioxide ($ZrO_2$), or a combination thereof.

In second aspect, the invention relates to a three-dimensional framework for producing three-dimensional crystalline foam having electrical conductive properties, comprising metal foam having a surface area of at least about 500 m$^2$/g.

Examples of metal powders that may be used include, but are not limited to, nickel (Ni), cobalt (Co), copper (Cu), iron (Fe), and platinum (Pt).

In a third aspect, the invention relates to a method of fabricating a three-dimensional crystalline graphene foam, comprising providing a three-dimensional metal foam framework having a surface area of at least about 500 m$^2$/g, for fabricating a three-dimensional graphene foam, depositing a layer of graphene onto the metal foam by template-directed chemical vapor deposition (CVD), depositing a polymer support onto the graphene layer, removing the three-dimensional metal foam framework via wet chemical etching, such that the graphene layer and the polymer support retain the three-dimensional configuration provided by the metal foam framework, and removing the polymer support using a solvent to thereby obtain the three-dimensional crystalline graphene foam.

The metal foam framework is fabricated using a method of the present invention comprising mixing a metal powder and a skelet powder together to obtain a uniform mixture, applying pressure to the mixture of the metal powder and the skelet powder to obtain a closed packed structure, applying temperature and pressure to the closed packed structure to melt the metal powder around the skelet powder, and removing the skelet powder using a chemical bath to dissolve the skelet powder away from the structure leaving voids, resulting in the metal foam framework.

In fourth aspect, the invention relates to a three-dimensional crystalline graphene foam, comprising: a core comprising a group IV-B element and a layer surrounding the core comprising graphene to form a three-dimensional crystalline foam comprising graphene and a group IV-B element. In one non-limiting embodiment, the group IV-B element is silicon. In another embodiment, the group IV-B element is germanium. In further embodiment, the group IV-B element is tin. In yet another embodiment, the group IV-B element is lead.

In a fifth aspect, the invention relates to a graphene-based electrode, comprising a ferroelectric polymer, and a graphene substrate, wherein the graphene substrate is coated with the ferroelectric polymer.

The graphene substrate can be a graphene foam, a graphene sheet, activated reduced graphene oxide, a graphene composite, or a combination thereof. The ferroelectric polymer can be a polymer comprising vinylidene fluoride, trifluoroethylene, chlorotrifluoroethylene, tetrafluoroethylene, hexafluoropropylene, 1,1-chlorofluoroethylene, or a combination thereof.

In one embodiment, the ferroelectric polymer is a blend comprising a ferroelectric polymer and a polar polymer. Examples of polar polymers include, but are not limited to, poly(methyl methacrylate), polyvinyl alcohol, poly(ethylene oxide), polyvinyl chloride, polyacrylonitrile, poly(ethyl methacrylate), or a combination thereof. In another embodiment, ferroelectric polymer further comprises an electrolyte.

In another aspect, the invention relates to a supercapacitor for improved charge and energy storage, comprising a first graphene-based electrode comprising a first graphene substrate and optionally a ferroelectric polymer that contacts a first surface of a porous separator with a first surface on the first graphene-based electrode; a second graphene-based electrode comprising a second graphene substrate and optionally a ferroelectric polymer that contacts the second surface of the porous separator with a first surface on the second graphene-based electrode, wherein at least one of the first and second graphene substrates is coated with the ferroelectric polymer; a first metal electrode making contact with the second surface on the first graphene-based electrode; and a second metal electrode making contact with the second surface on the second graphene-based electrode. The first graphene substrate and the second graphene substrate can be the same graphene substrate or different graphene substrates.

In a further aspect, the invention relates to a method of making a supercapacitor for improved charge and energy storage as described herein. The supercapacitor is made by the steps comprising, coating at least one of the graphene substrates with a ferroelectric polymer to form a graphene-based electrode wherein the ferroelectric polymer is coated throughout the graphene substrate; contacting a first graphene-based electrode, that is optionally coated with a ferroelectric polymer, to a first surface of a porous separator with a first surface on the first graphene-based electrode; contacting a second graphene-based electrode, that is optionally coated with a ferroelectric polymer, to the second surface of the porous separator with a first surface on a second graphene-based electrode; contacting a first metal electrode with the second surface on the first graphene-based electrode that is optionally coated with a ferroelectric polymer; and contacting a second metal electrode with the second surface on the second graphene-based electrode, that is optionally coated with ferroelectric polymer.

The present invention provides three-dimensional crystalline foams with high surface areas, high lithium capacity and high conductivity for use as electrode materials (e.g., supercapacitors) and methods for their synthesis.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
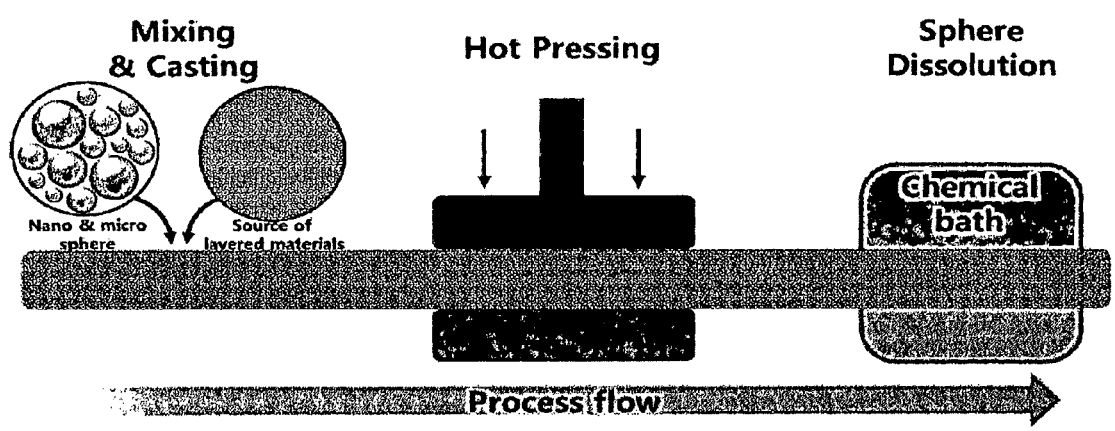
FIG. 1 is a general schematic of the process for the synthesis of three-dimensional (3-D) graphene foams using a source of layered materials and a skelet powder.

The present invention relates to crystalline three-dimensional (3-D) foams for use as electrode materials in energy storage devices, such as secondary battery, Li air battery, supercapacitor and fuel cell. The crystalline 3-D foams are highly porous providing materials with large surface area, have high Li capacity, and high conductivity.

Three-Dimensional Graphene Crystalline Foam

In one aspect, the invention relates to a method of fabricating a three-dimensional graphene crystalline foam, comprising mixing a carbon source and a skelet powder together to obtain a uniform mixture, wherein the carbon source is optionally coated on a group IV-B element, applying pressure to the mixture to obtain a closed packed structure, applying temperature and pressure to the closed packed structure to form a graphene sheet layered around the skelet powder and the group IV-B element if present, and removing the skelet powder from the closed packed structure using a chemical bath to dissolve the skelet powder away from the structure leaving voids, resulting in a three-dimensional crystalline foam comprising graphene and optionally a group IV-B element.

Graphene is a two dimensional sheet of carbon that has highly desirable physical properties for use in tissue regeneration and medical devices. Graphene is the strongest material known having a Young's modulus of 0.5-1 TPa, yet it is extremely flexible and not brittle. Graphene can be transferred onto any flat or irregular shaped surface and graphene-coated, flexible, supporting substrates can be easily bent into any shape required. While graphene is usually found in its two dimensional form, it is now possible to fabricate the graphene in a three dimensional intercalated network, known as graphene foam or 3-D graphene.

"Graphene," as the term is used herein, is defined as single or multiple layers of graphene sheets. [7,8] In one embodiment, graphene is multi-layer graphene. The term "multi-layer graphene" refers to graphene that has multiple layers of single atomic graphene. The graphene of the present invention can have between about 1 to about 20 layers. Preferably, the graphene has between about 10 to about 20 layers, more preferably between about 5 to about 10 layers, most preferably between about 1 to about 5 layers. In another embodiment of the invention, the graphene is single layer graphene.

As used herein, the term "single layer graphene" refers to a graphene monoatomic sheet that has less than or about 5% two or three layer graphene. For example, graphene grown on copper is self-terminating producing single layer graphene that has less than 5% two and three layer graphene flakes. In one non-limiting embodiment, the graphene has about 5% two and three layer graphene. In another embodiment, graphene has less than 5% two and three layer graphene.

The term "graphene foam" as used herein is taken to mean a three-dimensional intercalated network of single or multiple layers of continuously connected graphene sheets forming a porous network. As used herein, the term "intercalated" is taken to mean the insertion of a graphene sheet between two other graphene sheets or layers. In one embodiment, the pore walls are comprised of single layer and multiple layers of graphene. In another embodiment, the pore walls are comprised of a single layer of graphene. In yet another embodiment, the pore walls are comprised of multiple layers of graphene.

The term "skelet powder," as used herein, refers to a material that serves as a mold to create the pores of the three dimensional foam, when the skelet powder is removed in a further step in the synthetic process. The skelet powder can be of any shape (e.g., spherical, cylindrical, discoidal, etc.) and is made of a material that allows for removal from the three-dimensional foam product. The skelet powders of the invention include, but are not limited to, silicon dioxide ($SiO_2$), aluminum oxide ($Al_2O_3$), sodium chloride (NaCl), magnesium oxide (MgO), hafnium oxide ($HfO_2$), zirconium dioxide ($ZrO_2$), or a combination of one or more skelet powders. In one non-limiting embodiment, the skelet powder is silicon dioxide ($SiO_2$). In another embodiment, the skelet powder is aluminum oxide ($Al_2O_3$). In another embodiment, the skelet powder is sodium chloride (NaCl).

Figure 3:
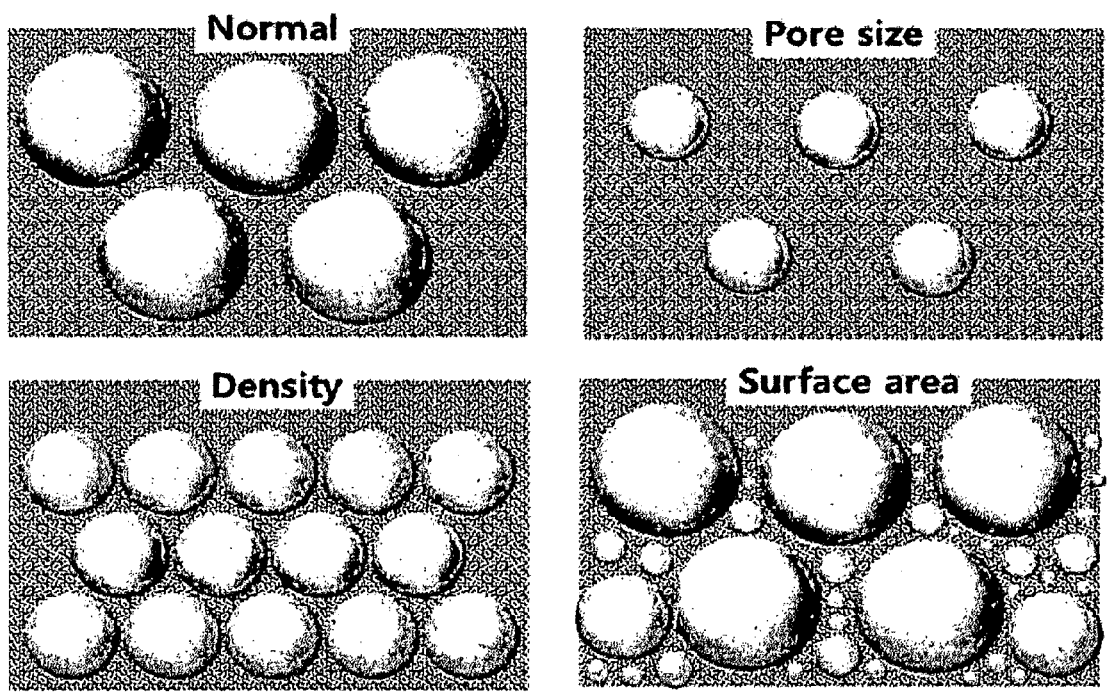
FIG. 3 is a schematic showing the ability of the method of the present invention to allow control of the pore size, density and surface area of the 3-D crystalline foam through the selection of the amount and size of the skelet powder.

Pore size, density, porosity and surface area can be controlled by the size, the amount, and the density of skelet powder present. (FIG. 3) The skelet powder can have a particle size between about 1 nm to about 10 µM, preferably between about 1 nm to about 1 µM, and most preferably between about 5 nm to about 100 nm. The skelet powder can be removed by treatment of the resulting closed packed structure with a chemical bath. The chemical bath dissolves the skelet powder creating a void while leaving the surrounding foam intact.

The chemical bath used to remove the skelet powder depends on the identity of the skelet powder. The chemical bath can be an acidic, basic or neutral solution. Chemical baths include, but are not limited to, potassium hydroxide (KOH) solution, NaOH (sodium hydroxide) solution, lithium hydroxide (LiOH) solution, sulfuric acid ($H_2SO_4$) solution, nitric acid ($HNO_3$) solution, hydrochloric acid (HCl) solution, hydrofluoric acid (HF), acetic acid ($CH_3CO_2H$), aqua regia/nitric acid hydrochloride ($HNO_3.3HCl$), and water, or a combination thereof. For example, a ceramic skelet powder can be dissolved using a KOH or NaOH solution, while a mineral skelet powder can be dissolved using water.

As used herein, "carbon source" refers to a material that provides a source of carbon atoms that will be incorporated into the final product (e.g., graphene, graphene foam, etc.). The carbon source is capable of forming crystalline graphene when heated under pressure. Examples of carbon sources include, but are not limited to, carbon black, amorphous carbon, single-wall carbon nanotubes, multi-wall nanotubes, graphene oxide, and graphite powder, or a combination thereof. The carbon source can be coated onto group IV-B elements allowing the incorporation of the group IV-B elements into the structure of the crystalline graphene foam. For example, the carbon-coated group IV-B element can be a carbon-coated silicon nanoparticle. The group IV-B elements of the present invention include, but are not limited to, silicon (Si), germanium (Ge), tin (Sn) and lead (Pb), or combinations thereof. For example, carbon-coated silicon powders can be used as a carbon source in the method of the present invention to produce a three-dimensional crystalline foam comprising graphene and silicon.

Figure 2:
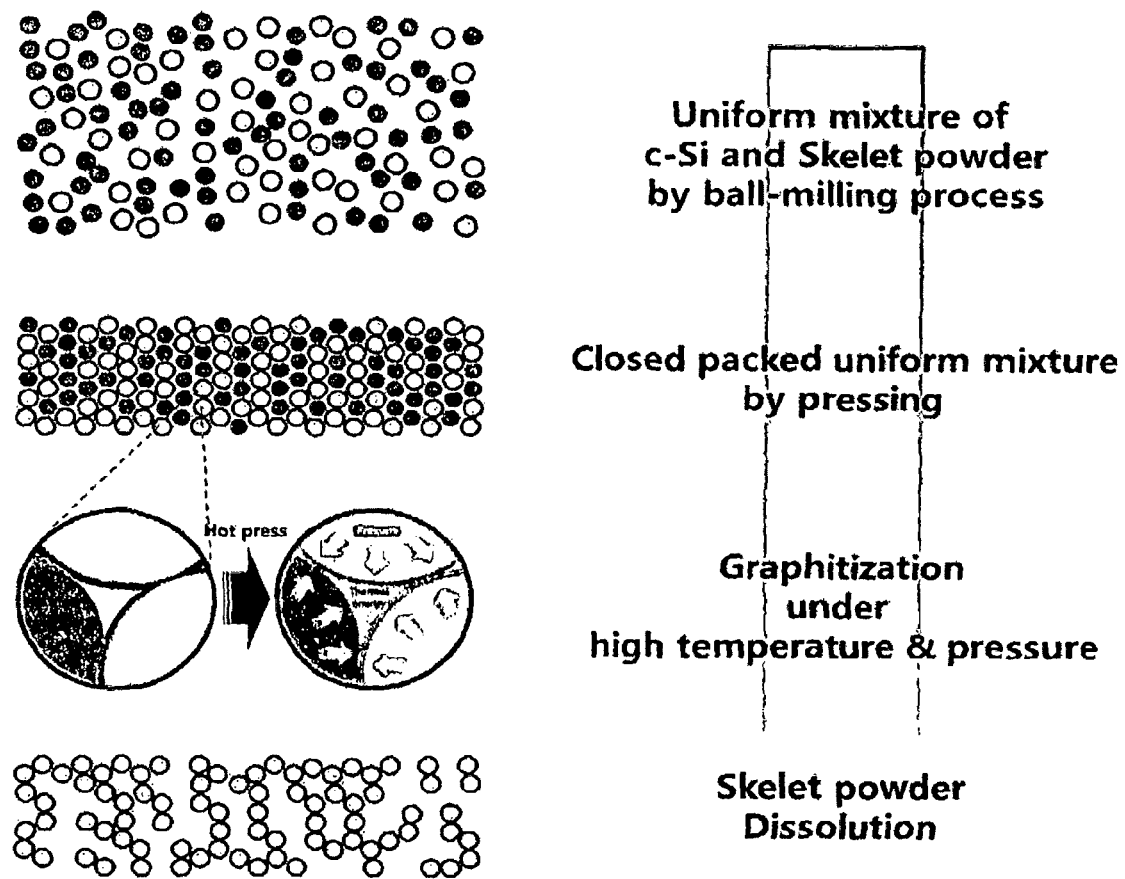
FIG. 2 is a detailed schematic of the process for the synthesis of the three-dimensional crystalline graphene foam containing silicon using carbon-coated silicon.

The mixture of the carbon source, optionally coated with a group IV-B element, and a skelet powder is mixed to form a uniform mixture (FIG. 2). As used herein, the term "uniform mixture" is taken to mean a mixture containing an even distribution of the components that comprise the mixture. The uniform mixture can be obtained by various mixing methods. For example, a uniform mixture where the carbon source, optionally coated with a group IV-B element, and the skelet powder are approximately evenly distributed throughout the mixture can be obtained by ball milling. Once the uniform mixture is obtained, a closed packed structure is achieved by applying pressure to the uniform mixture of carbon source, optionally coated with a group IV-B element, and the skelet powder. The pressure can be applied in a uniform direction or in any manner that allows attainment of a closed packed of the desired density and shape. (FIG. 2) As used herein, "closed packed structure" refers to a structure where the materials or mixture of materials (e.g., the skelet powder and the carbon source) are packed together so as to occupy the minimum amount of space. The pressure applied to obtain a closed packed structure can be between about 0.1 MPa to about 50 MPa. In one embodiment the pressure applied to obtain the closed packed structure is between about 1 MPa to about 40 MPa. In another embodiment, the pressure applied to obtain the closed packed structure is between about 10 MPa to about 40 MPa.

The 3-D structures are obtained by applying temperature and pressure to the closed packed structure to form graphene sheets layered around the skelet powder and the group IV-B element, if present. The temperature applied can be between about 800° C. to about 3400° C. Preferably the temperature is between about 1000° C. to about 2500° C., more preferably about 1500° C. to about 2200° C. The pressure can be applied in a uniform direction or in one or more directions. The pressure applied can be between about 0.1 MPa to about 50 MPa. Preferably, the pressure applied is between about 1 MPa to about 40 MPa, more preferably between about 10 MPa to about 40 MPa.

In a second aspect of the invention, the invention relates to a three-dimensional crystalline graphene foam, comprising a core comprising a group IV-B element, and a layer surrounding the core comprising graphene to form a three-dimensional crystalline foam comprising graphene and a group IV-B element. The term "core," as used herein, means a group IV-B element surrounded by one or more layers of graphene sheets. The use of silicon as the group IV-B element will be described below for illustration purposes but other group IV-B elements can similarly be used. For example, a carbon-coated silicon powder and skelet powder are mixed together to obtain a uniform mixture using a ball milling process. Pressure is applied to the mixture to achieve a closed packed structure. Temperature and pressure are then applied to form graphene sheets around the skelet powder and the silicon and the skelet powder is removed by dissolution. Removal of the skelet powder leaves voids resulting in the three-dimensional crystalline foam comprising graphene and silicon.

Synthesis of Three-Dimensional Crystalline Metal Foams Frameworks

In a third aspect, the invention relates to a method of fabricating a three-dimensional crystalline graphene foam, comprising providing a three-dimensional metal foam framework having a surface area of at least about 500 $m^2/g$, for fabricating a three-dimensional graphene foam, depositing a layer of graphene onto the metal foam by template-directed chemical vapor deposition (CVD), depositing a polymer support onto the graphene layer, removing the three-dimensional metal foam framework via wet chemical etching, such that the graphene layer and the polymer support retain the three-dimensional configuration provided by the metal foam framework, and removing the polymer support using a solvent to thereby obtain the three-dimensional crystalline graphene foam. Known methods for the synthesis of metal foams (e.g., organic precursor combustion, co-evaporation/dealloying, and polymer beads template and CVD) provide metal foams with a maximum surface area of 500 $m^2/g$. The method of the present invention allows for the synthesis of three-dimensional metal foams with high porosity (fraction of void volume to total volume) and high specific surface area (>500 $m^2/g$).

Pore size, density, porosity and surface area can be controlled by the size, the amount, and the density of skelet powder present. (FIG. 3) The skelet powder can have a particle size between about 1 nm to about 10 μM, preferably between about 1 nm to about 1 μM, and most preferably between about 5 nm to about 100 nm. The method of the present invention produces 3-D metal foams having surface areas between about 200 $m^2/g$ to about 2000 $m^2/g$. Preferably, metal foams having surface areas between about 500 to about 2000 $m^2/g$.

The skelet powder can be removed by treating the resulting closed packed structure using a chemical bath creating a void and leaving the surrounding metal foam intact. The chemical bath dissolves the skelet powder and removing it from the closed packed structure to provide the metal foam framework. Examples of chemical baths are provided above.

Various metal powders can be used. Examples of metal powders that may be used include, but are not limited to, nickel (Ni), cobalt (Co), copper (Cu), iron (Fe), platinum (Pt). The metal foam can be fabricated using at least one metal powder but may be made using a mixture of one or more metal powders.

Figure 4:
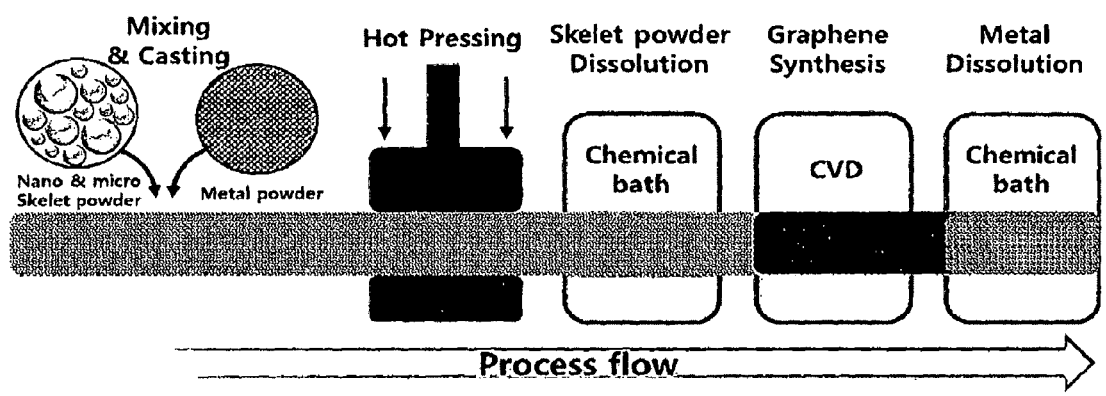
FIG. 4 is a general schematic of the process for the synthesis of three-dimensional (3-D) graphene foams from a metal foam.
Figure 5:
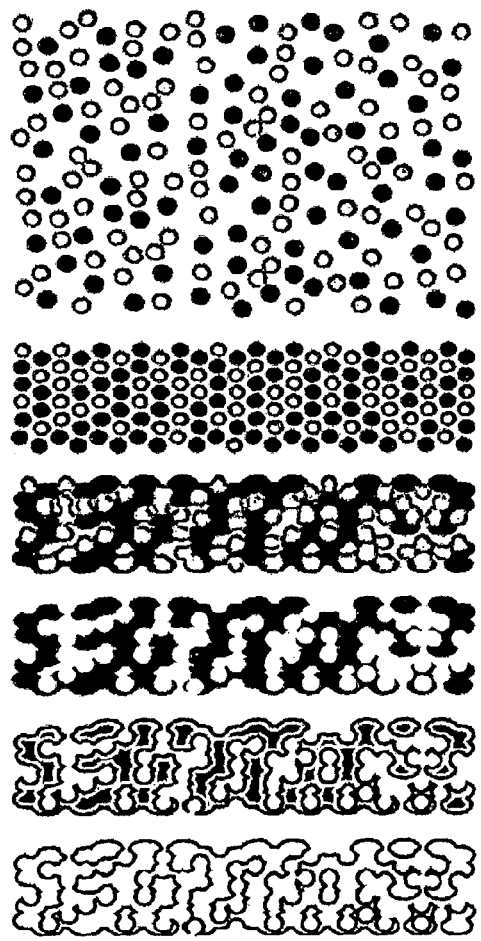
FIG. 5 is a detailed schematic of the process for the synthesis of 3-D graphene foams from a metal foam.

The synthesis of the metal foam begins by mixing of the metal powder and the skelet powder. (FIGS. 4 and 5) A uniform mixture of metal powder and skelet powders is obtained, for example, by a simple ball-milling process. The obtained uniform mixture settles to form a closed packed structure through the application of pressure. The pressure can be applied in a uniform direction or in any manner that allows attainment of a closed packed structure of the desired density and shape. (FIG. 2) The pressure applied to obtain the closed packed structure can be between about 0.1 MPa to about 50 MPa. In one embodiment the pressure applied to obtain the closed packed structure is between about 1 MPa to about 40 MPa. In another embodiment, the pressure applied to obtain the closed packed structure is between about 10 MPa to about 40 MPa.

Temperature and pressure are applied to the closed packed structure to melt the metal powder around the skelet powder. The temperature applied can be between about 80° C. to about 3400° C. depending on the identity of the metal. In one embodiment, the temperature is between about 100° C. to about 250° C. In another embodiment, the temperature is between about 150° C. to about 220° C.

The pressure can be applied in a uniform direction or in one or more directions. The pressure applied can be between about 0.1 MPa to about 50 MPa. Preferably the pressure applied is between about 0.1 MPa to about 40 MPa, more preferably between about 0.1 MPa to about 30 MPa, even more preferably between about 0.1 MPa to about 1 MPa.

The 3-D metal foam framework can be used as template for the chemical vapor deposition (CVD) growth of graphene foam. Chemical vapor deposition (CVD) refers to a chemical process used to produce high-purity, high-performance solid materials where a template is exposed to one or more volatile precursors, which react and/or decompose on the template surface to produce the desired deposit. Graphene can be directly deposited using CVD onto any template suitable for preparation of graphene. Templates are not limited to planar substrates but can be three dimensional forms of nickel, copper or any other material facilitating the growth of graphene. For example, the template can be a foam-like shape (e.g., nickel foam). Metal foams that include a suitable metal for graphene growth can be produced in many different shapes and forms. All of the templates can be subsequently removed by chemical wet etching. [6]

Templates that may be used for growing graphene include, but are not limited to, nickel, copper, scandium, titanium, vanadium, manganese, iron, cobalt, ruthenium, platinum, silicon carbide (SiC) and may include also non-metal or non-oxide substrates.

To prevent collapse of the graphene foam network upon removal of the metal foam template, a thin layer of polymer (e.g., poly(methylmethacrylate) (PMMA)) is deposited onto the graphene foam prior to removal of the metal foam template. The polymer support can be removed by dissolving the polymer using a solvent to yield the graphene foam product. For example, PMMA can easily be removed from the graphene foam after chemical etching using hot acetone. In one embodiment, a polymer support is deposited on the graphene foam prior to chemical etching. In another embodiment, the polymer support deposited on the graphene foam prior to chemical etching is poly(methylmethacrylate). The skilled person can readily recognize the solvent(s) to be used for the removal of the polymer support.

The metal foam framework is removed via chemical etching to provide the crystalline graphene foam. Chemical etching as defined herein is a process of using acids, bases or other chemicals to dissolve a metal template. For example, a nickel foam framework can be removed after chemical vapor deposition of graphene using hot hydrochloric acid (HCl) or HCl/iron chloride ($FeCl_3$) solution of the nickel to provide the 3-D crystalline graphene foam remaining as the porous network of graphene. The graphene foam adopts the interconnected three-dimensional scaffold structure of the nickel foam framework. All of the graphene sheets in the graphene foam are in direct contact with one another.

In a another aspect of the present invention, the invention relates to a three-dimensional framework for producing three-dimensional crystalline foam having electrical conductive properties, comprising a metal foam having a surface area of at least 500 $m^2/g$. As used herein, the term "framework" refers to a three-dimensional matrix upon which graphene sheets can be deposited to form a three-dimensional graphene network. "Electrical conductive properties," as used herein, means the ability to permit the flow of electric charges in one or more directions or the ability to conduct an electric current. In addition to serving as a framework for CVD synthesis of graphene, the metal foams of the present invention have many fields of application. The foams may be used, for example, in light emitting diodes (LEDs) and lasers, as catalysts, gas containers, energy/impact absorbers, heat absorbers, heat exchangers, lightweight composite panels, electrode supports, electrodes for electric accumulators or batteries, electrodes for fuel cells and as materials for optics, acoustics, structures and automotives. The metal foams can also be utilized in many areas of nanotechnology.

Graphene-Based Supercapacitors

Fuel cells and batteries possess high energy density (200 to 1000 W·h/kg, and 10 to 300 W·h/kg, respectively), but their power density is quite low (typically below 500 W/kg) due to the slow movement of charge carriers limiting their applications in many high-power systems. Electrochemical supercapacitors are able to offer improved power density (101 to 106 W/kg) at moderate energy density (0.04 to 30 W·h/kg), but their charge or discharge process still requires seconds or even tens of seconds. Supercapacitors have superior output density while having short charge and discharge periods. As a result supercapacitors are drawing much attention as new generation energy storage device, along with secondary batteries.

Supercapacitors can be classified into three types according to electrode materials and mechanisms. Supercapacitors may be classified into the following types: electric double layer capacitors (EDLCs) using nanoporous material, typically activated charcoal, as an electrode and adopting an electric-charge absorption mechanism in electrical double layers, metal oxide electrode pseudo-capacitors ('redox capacitors') using transition metal oxides and conductive polymers for electrodes and adopting a mechanism associated with pseudo-capacitance, and hybrid capacitors having intermediate characteristics of the EDLCs and the redox (electrolytic) capacitors.

In general, EDLCs improve storage density through the use of a nanoporous material rather than the conventional insulating dielectric barrier. The specific capacitance of nanoporous materials is proportional to the surface area of the material. Since the surface area of the nanoporous material is many times greater than a traditional material like aluminum, many more ions or radicals from the electrolyte can be stored in a given volume. Typically, EDLCs use activated carbon as the porous material. However, it is not the optimal material for this application. The charge carriers it provides are far larger than the holes left in the charcoal, which are too small to accept them, limiting the storage. The present invention provides a graphene-based supercapacitor with faster charging and discharging times and long-term energy storage.

In a further aspect of the invention, the invention relates to a supercapacitor for improved charge and energy storage, comprising a first graphene-based electrode comprising a first graphene substrate and optionally a ferroelectric polymer that contacts a first surface of a porous separator with a first surface on the first graphene-based electrode; a second graphene-based electrode comprising a second graphene substrate and optionally a ferroelectric polymer that contacts the second surface of the porous separator with a first surface on a second graphene-based electrode, wherein at least one of the first and second graphene substrates is coated with the ferroelectric polymer; a first metal electrode making contact with the second surface on the first graphene-based electrode; and a second metal electrode making contact with the second surface on the second graphene-based electrode. (See FIG. 6). The graphene-based electrodes have high exposed surface area, and thus an extremely high capacitance value, enhancing the amounts of the charge and energy that can be stored.

The supercapacitor of the present invention comprises a pair of graphene-based electrodes (e.g., graphene foam, etc.), a porous separator, and two metal electrodes. (FIG. 6) At least one of the graphene-based electrodes is coated with a ferroelectric polymer. The porous separator can be an insulating separator. As used herein, an "insulating separator" refers to a porous electrically-insulating material which prevents electrical contact between the graphene-based electrodes but allows movement of ions. For example, the porous separator can be a dielectric polymer.

In another aspect of the present invention, the invention relates to a graphene-based electrode, comprising a ferroelectric polymer and a graphene substrate, wherein the graphene substrate is coated with the ferroelectric polymer. The term "graphene-based" is used herein and in the claims as shorthand to mean graphene, a graphene derivative (e.g., graphene oxide), functionalized graphene, or a combination thereof.

The graphene substrates of the present invention include, but are not limited to graphene, graphene foams, activated reduced graphene oxide, and graphene composites. Graphene composites of the invention include, but are not limited to, polymer-graphene composites, metal-graphene composites, graphene-based composites and ceramic-graphene composites, or a combination thereof. In one embodiment, the graphene composite comprises a graphene foam and a carbon nanotube. In another embodiment, the graphene composite comprises graphene and metal oxide nano particles.

The graphene substrates can be single or multiple layers graphene. In one embodiment, graphene substrate is multilayer graphene. The graphene substrates can have between about 1 to about 20 layers. Preferably the graphene has between about 10 to about 20 layers, more preferably between about 5 to about 10 layers, most preferably between about 1 to about 5 layers. In another embodiment of the invention, the graphene substrate is single layer graphene. In one non-limiting embodiment, the graphene has about 5% two and three layer graphene. In another embodiment, graphene has less than 5% two and three layer graphene.

The graphene substrates of the present invention include corrugated graphene substrates that can increase the surface area of the electrode and allow the electrode, when used as part of a supercapacitor, to store higher energy. The graphene foam can be synthesized by the methods of the present invention described above or by other known methods.

As used herein, a "ferroelectric polymer" refers to polymers that maintain a permanent electric polarization that can be reversed, or switched in the presence of an external electric field. The ferroelectric polymer can be a polymer or a copolymer. As used herein, the term "polymer" refers to a macromolecule made of repeating monomer units. The term "copolymer" is defined as a polymer of at least two chemically distinct monomers. The copolymers of the invention include, but are not limited to, alternating copolymers, statistical copolymers, block copolymers, random copolymer, and graft copolymers. In one embodiment, the polymer used to form the ferroelectric polymer is a polymer comprising at least one monomer. In another embodiment, the polymer used to form the ferroelectric polymer is a copolymer comprising one or more monomers.

The ferroelectric polymer coats the graphene substrate. The graphene substrate can be coated using any method that fills essentially all of the pores cavities or covers essentially the entire surface of the graphene substrate (e.g., >99% coated). For example, a graphene foam can be coated by soaking the foam in a ferroelectric polymer solution. A graphene sheet can be coated, for example, by layering of the ferroelectric polymer onto the graphene sheet.

The monomers that can be used to synthesize the ferroelectric polymers of the present invention include, but are not limited to, vinylidene fluoride, trifluoroethylene, chlorotrifluoroethylene, tetrafluoroethylene, hexafluoropropylene, 1,1-chlorofluoroethylene. The ferroelectric polymers of the present invention can be a copolymer comprising two or more monomers. In one embodiment, the ferroelectric polymer is polyvinylidene fluoride (PVDF). In another embodiment, the ferroelectric polymer is a copolymer comprising vinylidene fluoride and trifluoroethylene. In yet another embodiment, the ferroelectric polymer is a copolymer comprising vinylidene fluoride and chlorotrifluoroethylene. In another embodiment, the ferroelectric polymer is a copolymer comprising vinylidene fluoride, trifluoroethylene and chlorotrifluoroethylene.

In another aspect of the invention, the ferroelectric polymers can be a blend of a ferroelectric polymer and at least one polar polymer. Blending of the ferroelectric polymer with a polar polymer can assist in increasing the breakdown voltage of the ferroelectric polymer. Polar polymers that can be blended with the ferroelectric polymer include, but are not limited to poly(methyl methacrylate) (PMMA), polyvinyl alcohol (PVA), poly(ethylene oxide) (PEO), polyvinyl chloride (PVC), polyacrylonitrile (PAN), poly(ethyl methacrylate) (PEMA). The blend can contain more than one polar polymer. For example, the ferroelectric polymer can be a blend of a ferroelectric polymer, PMMA and PVC.

The ferroelectric polymers can further contain at least one electrolyte. Examples of electrolytes that may be used as part of the invention include, but are not limited to, lithium perchlorate ($LiClO_4$), lithium tetrafluoroborate ($LiBF_4$), lithium trifluoromethane sulfonate ($LiCF_3SO_3$), and lithium iron phosphate ($LiFePO_4$) or combinations there of. The electrolytes are present in an amount between about 1 wt % to about 30 wt % of the total amount of ferroelectric polymer and electrolytes present. Preferably the amount of electrolyte is between about 2.5 wt % to about 20 wt %, more preferably between about 5 wt % to about 10 wt %.

Figure 6:
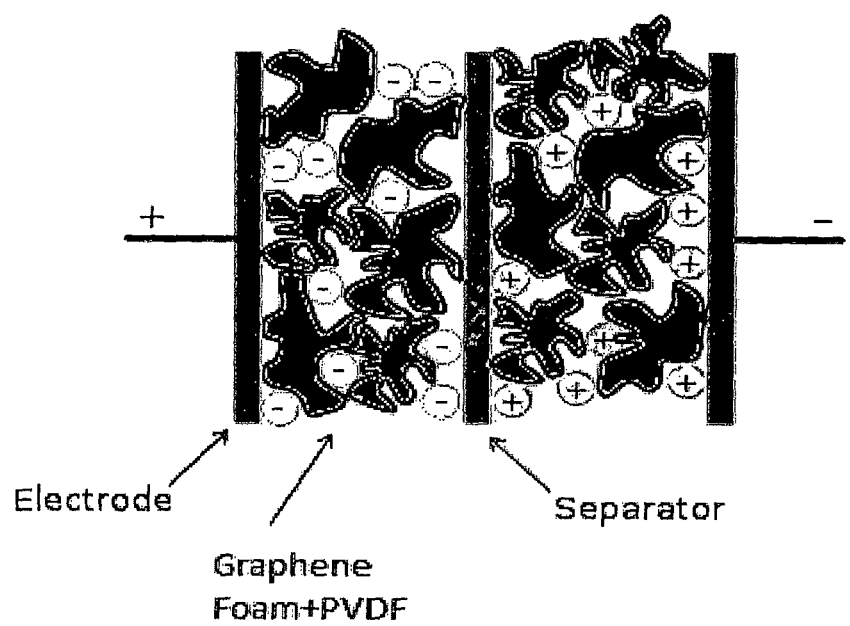
FIG. 6 is a schematic of graphene-based supercapacitor of the present invention. Both graphene-based electrodes in FIG. 6 are shown as being coated in a ferroelectric polymer but one of the graphene-based electrodes can be uncoated (e.g., a graphene substrate).

In another aspect of the invention, the invention relates to a method of making a supercapacitor for improved charge and energy storage, comprising coating at least one of the graphene substrates with a ferroelectric polymer to form a graphene-based electrode, wherein the ferroelectric polymer is coated throughout the graphene substrate; contacting a first graphene-based electrode that is optionally coated with a ferroelectric polymer to a first surface of a porous separator with a first surface on the first graphene-based electrode; contacting a second graphene-based electrode, that is optionally coated with a ferroelectric polymer, to the second surface of the porous separator with a first surface on the second graphene-based electrode; contacting a first metal electrode with the second surface on the first graphene-based electrode that is optionally coated with a ferroelectric polymer; and contacting a second metal electrode with the second surface on the second graphene-based electrode, that is optionally coated with ferroelectric polymer. (FIG. 6)

The first and second graphene-based electrodes can be the same graphene substrate or different graphene substrates. For example, the first graphene substrate can be a graphene foam and the second graphene substrate may be a graphene composite. The second surface of the first electrode is placed in contact with a first metal electrode. A second electrode is then placed in contact with the second surface of the second electrode to form the supercapacitor depicted in FIG. 6.

The first graphene-based electrode and second graphene-based electrode can be a graphene substrate and may or may not be coated with a ferroelectric polymer but at least one graphene-based electrode must be coated with a ferroelectric polymer. For example, a first electrode can be a graphene foam coated with a ferroelectric polymer and the second electrode can be a graphene foam. A symmetrical supercapacitor is obtained when both electrodes comprise a graphene-based electrode comprising a graphene substrate and a ferroelectric polymer. Coating of only one of the graphene-based electrodes results in an asymmetrical supercapacitor. In one embodiment, the supercapacitor is a symmetrical supercapacitor. In another embodiment, the supercapacitor is an asymmetrical supercapacitor.

EXEMPLIFICATION

EXAMPLE 1

Preparation of Si/Graphene Three-Dimensional Foam 0.1 to 10 wt % of polyvinyl alcohol (PVA) was dissolved in distilled water at 60° C. and silicon nano powders were then added to the PVA solution. The PVA coated Si-nano powder (Si/PVA) was then obtain upon centrifugation. The resulting Si/PVA was calcined at 400~900° C.

Carbonization temperature was determined based on the result of thermo gravimetric analysis (TGA) of PVA. As described in FIGS. 1 and 2, a uniform mixture of c-Si and skelet powders can be obtained by simple ball-milling. The obtained uniform mixture settles to form a closed packed structure through the application of moderate pressure or "pressing" down on the uniform mixture. The mixture is then heated and pressure is applied to the whole volume and in a uniform direction to allow formation of the graphene sheets around the skelet powder and Si— particles. The skelet powders are removed by dissolving the skelet powder with KOH or NaOH solution to obtain the 3-D Si/graphene crystalline foam.

REFERENCES

1. M. Winter, J. O. Besenhard, M. E. Spahr, P. Novak, *Adv. Mater.* 10, 725 (1998).
2. J. Hassoun, G. Derrien, S. Panero, B. Scrosati, *Adv. Mater.* 20, 3169 (2008).
3. J. Li, J. R. Dahn, *J. Electrochem. Soc.* 154, A156 (2007).
4. C. M. Park, K. H. Kim, H. Kim, H.-J. Sohn, *Chem. Soc. Rev.* 39, 3115 (2010).
5. Chen, Z., Ren, W., Gao, L., Liu, B., Pei, S. Cheng, H.-M., *Nature Materials*, 10, 424-428 (2011).
6. H. X. Ji, L. L. Zhang, M. T. Pettes, H. F. Li, S. S. Chen, L. Shi, R. Piner, R. S. Ruoff, *Nano Lett*, 12, 5, 2446 (2012).
7. K. S. Novoselov, D. Jiang, F. Schedin, T. J. Booth, V. V. Khotkevich, S. V. Morozov, A. K. Geim, *PNAS*, 102, 30, 10451 (2005).
8. K. S. Novoselov, A. K. Geim, S. V. Morozov, D. Jiang, Y. Zhang, S. V. Dubonos, L. V. Grigorieva, A. A. Firsov, *Science*, 306, 5696, 666, 2004.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A three-dimensional crystalline graphene foam, comprising a core that includes a group IV-B element and a graphene layer surrounding the core, wherein the three-dimensional crystalline graphene foam is produced by the steps of:
   a) mixing a carbon source coated on a group IV-B element and a skelet powder together to obtain a uniform mixture, the skelet powder having a particle size of 1 nm to 10 μm;
   b) applying pressure to the uniform mixture obtained in step (a) to obtain a closed packed structure;
   c) applying temperature and pressure to the closed packed structure to form a graphene sheet layered around the skelet powder and the group IV-B element; and
   d) removing the skelet powder from the closed packed structure using a chemical bath to dissolve the skelet powder away from the closed packed structure leaving voids, thereby forming the three-dimensional crystalline graphene foam.

2. The three-dimensional crystalline graphene foam of claim 1, wherein the pressure applied in step (b) is between 0.1 MPa and 50 MPa.

3. The three-dimensional crystalline graphene foam of claim 2, wherein the pressure applied in step (c) is between 0.1 MPa and 50 MPa.

4. The three-dimensional crystalline graphene foam of claim 3, wherein the temperature applied in step (c) is between 800° C. and 3400° C.

5. The three-dimensional crystalline graphene foam of claim 4, wherein the group IV-B element is silicon, germanium, tin, lead, or a combination thereof.

6. The three-dimensional crystalline graphene foam of claim 5, wherein the group IV-B element is a silicon nanoparticle.

7. The three-dimensional crystalline graphene foam of claim 1, wherein the skelet powder has a particle size of 1 nm to 1 μm.

8. The three-dimensional crystalline graphene foam of claim 7, wherein the pressure applied in step (b) is between 0.1 MPa and 50 MPa.

9. The three-dimensional crystalline graphene foam of claim 8, wherein the pressure applied in step (c) is between 0.1 MPa and 50 MPa.

10. The three-dimensional crystalline graphene foam of claim 9, wherein the temperature applied in step (c) is between 800° C. and 3400° C.

11. The three-dimensional crystalline graphene foam of claim 10, wherein the group IV-B element is silicon, germanium, tin, lead, or a combination thereof.

12. The three-dimensional crystalline graphene foam of claim 11, wherein the group IV-B element is a silicon nanoparticle.

13. The three-dimensional crystalline graphene foam of claim 1, wherein the skelet powder has a particle size of 5 nm to 100 nm.

14. The three-dimensional crystalline graphene foam of claim 13, wherein the pressure applied in step (b) is between 0.1 MPa and 50 MPa.

15. The three-dimensional crystalline graphene foam of claim 14, wherein the pressure applied in step (c) is between 0.1 MPa and 50 MPa.

16. The three-dimensional crystalline graphene foam of claim 15, wherein the temperature applied in step (c) is between 800° C. and 3400° C.

17. The three-dimensional crystalline graphene foam of claim 16, wherein the group IV-B element is silicon, germanium, tin, lead, or a combination thereof.

18. The three-dimensional crystalline graphene foam of claim 17, wherein the group IV-B element is a silicon nanoparticle.

19. A three-dimensional crystalline graphene foam, comprising a core that includes a group IV-B element and 1 to 20 layers of graphene surrounding the core, wherein the 1 to 20 layers of graphene are arranged as an intercalated network of continuously connected graphene sheets forming a porous network.

20. The three-dimensional crystalline graphene foam of claim 19, wherein 1 to 5 layers of graphene surround the core.

21. The three-dimensional crystalline graphene foam of claim 20, wherein the group IV-B element is silicon, germanium, tin, lead, or a combination thereof.

* * * * *